United States Patent
May et al.

[11] Patent Number: 5,950,106
[45] Date of Patent: Sep. 7, 1999

[54] METHOD OF PATTERNING A METAL SUBSTRATE USING SPIN-ON GLASS AS A HARD MASK

[75] Inventors: Charles E. May; Robert Dawson, both of Austin, Tex.

[73] Assignee: Advanced Micro Devices, Inc., Sunnyvale, Calif.

[21] Appl. No.: 08/647,510

[22] Filed: May 14, 1996

[51] Int. Cl.$^6$ .................................................. H01L 21/44
[52] U.S. Cl. ........................ 438/669; 671/687; 671/688; 671/945; 671/950; 717/720; 717/723; 717/725; 717/734
[58] Field of Search ..................................... 438/950, 945, 438/720, 717, 723, 725, 734, 736, 742, 687, 688, 669, 671

[56] References Cited

U.S. PATENT DOCUMENTS

| | | | |
|---|---|---|---|
| 4,244,799 | 1/1981 | Fraser et al. | 204/192 |
| 4,801,560 | 1/1989 | Wood et al. | 438/725 |
| 5,100,503 | 3/1992 | Allman et al. | 156/643 |
| 5,127,987 | 7/1992 | Okudaira et al. | 438/717 |
| 5,160,404 | 11/1992 | Motoyama | 156/643 |
| 5,204,285 | 4/1993 | Kakiuchi | 438/669 |
| 5,250,472 | 10/1993 | Chen et al. | 437/231 |
| 5,264,076 | 11/1993 | Cuthbert et al. | 156/657 |
| 5,286,607 | 2/1994 | Brown | 430/313 |
| 5,286,675 | 2/1994 | Chen et al. | 437/195 |
| 5,376,227 | 12/1994 | Lee | 156/643 |
| 5,378,311 | 1/1995 | Nagayama et al. | 438/694 |
| 5,407,529 | 4/1995 | Homma | 438/671 |
| 5,439,847 | 8/1995 | Chittipeddi et al. | 438/671 |
| 5,449,644 | 9/1995 | Hong et al. | 437/225 |
| 5,461,010 | 10/1995 | Chen et al. | 437/228 |
| 5,488,011 | 1/1996 | Figura et al. | 437/60 |
| 5,665,641 | 9/1997 | Shen et al. | 438/643 |
| 5,756,401 | 5/1998 | Iizuka | 438/719 |

*Primary Examiner*—Jey Tsai
*Assistant Examiner*—Lynne A. Gurley
*Attorney, Agent, or Firm*—Skjerven, Morrill, MacPherson, Franklin & Friel, L.L.P.; William W. Holloway

[57] ABSTRACT

A method for patterning an underlying metal substrate includes forming a layer of spin-on glass over the metal substrate, forming a layer of photoresist over the spin-on glass, patterning the photoresist, patterning the spin-on glass using the photoresist as a mask, and patterning the metal substrate by applying an etch using the spin-on glass as a hard mask wherein the etch removes the photoresist and partially removes the spin-on glass. In one embodiment, the spin-on glass is patterned by applying a fluorine-based plasma, an aluminum-based metal substrate is patterned by applying a chlorine-based plasma in which an etch selectivity of the metal substrate to the spin-on glass is at least 10:1, and the spin-on glass is removed by applying another fluorine-based plasma.

29 Claims, 2 Drawing Sheets

METHOD OF PATTERNING A METAL SUBSTRATE USING SPIN-ON GLASS AS A HARD MASK

BACKGROUND OF THE INVENTION

1. Field of the Invention

The present invention relates to patterning substrates, and more particularly to method of patterning an underlying substrate using spin-on glass as a hard mask.

2. Description of Related Art

Integrated circuit manufacture requires that precisely defined regions be exposed to etchants in order to selectively remove material from the regions. The patterns that define the regions are often created by lithographic processes. For instance, a layer of photoresist is spin-coated onto a wafer substrate, and the resist layer is selectively exposed to a form of radiation, such as ultraviolet light, electrons, or x-rays. An exposure tool and mask, or data tape in electron beam lithography, are used to effect the desired selective exposure. Openings in the resist corresponding to the selective exposure are formed in a subsequent development step. Next, an etch is applied, and the regions of the substrate exposed by the openings are removed. The etching provides subtractive pattern transfer to the underlying substrate.

The photoresist performs two primary functions: precise pattern formation, and protection of the substrate during etch. Photoresist resolution refers to the ability of the photoresist to accurately match the pattern of the lithographic exposure equipment. Photoresist resolution is a key parameter that depends on several factors including the contrast, swelling, and thickness of the photoresist, as well as proximity effects (e.g., an isolated opening). As the photoresist becomes thicker, the openings near the bottom surface tend to narrow. As a result, thicker photoresist tends to limit the resolution. Therefore, generally speaking, the resolution is improved by thinning the photoresist. That is, thinner resist allows extending standard exposure tools to finer geometries. However, the photoresist must remain thick enough to avoid being removed by the etchant. For instance, for submicron patterns, the photoresist might be approximately 2 to 3 times as thick as an underlying metal substrate in order to adequately protect the substrate from an etchant that is particularly harsh to the photoresist. Unfortunately, at this thickness, the resolution of the photoresist may produce significant deviations between the desired pattern and the actual pattern transferred to the substrate. Accordingly, there is a need for using thinner photoresist layers while assuring that covered portions of the substrate remain protected from the etch.

Spin-on glass is finding increasing use as an interlevel insulator that can be planarized. Spin-on glass is of particular interest because the deposition process and planarization is relatively simple and the process utilizes low cost equipment.

U.S. Pat. No. 5,264,076 to Cuthbert et al. discloses an integrated circuit process using a non-conformal layer of spin-on glass as a hard mask for patterning an underlying nonplanar layer of polysilicon. The method includes forming nonplanar features on a substrate, covering the features with a conformal layer of polysilicon, covering the polysilicon with a non-conformal layer of spin-on glass, and covering the spin-on glass with photoresist. The spin-on glass provides a planar surface for the resist in order to reduce variations in resist thickness that cause variations in linewidths. The photoresist is patterned using lithography, and then the spin-on glass is patterned using the photoresist as an etch mask. Next, the photoresist is removed. Thereafter, the underlying polysilicon is etched using the spin-on glass as a hard mask. A drawback to this approach is that a separate step is required for removing the photoresist, which adds unnecessary process complexity. Another drawback is that the photoresist does not assist the spin-on glass when the polysilicon is etched.

Accordingly, a need exists for an efficient method of patterning a substrate using a thin layer of photoresist while adequately protecting the substrate from the etch.

SUMMARY OF THE INVENTION

The invention provides an improved method of patterning an underlying substrate by forming a layer of spin-on glass over the substrate, forming a patterned material over the spin-on glass, patterning the spin-on glass using the patterned material as an etch mask, and patterning the substrate by applying an etch using the spin-on glass as a hard mask wherein the etch removes the patterned material. Advantageously, the patterned material can be a thin material that is removed at the same time the substrate is patterned using a single etch step.

In accordance with one embodiment of the invention, the method includes forming a layer of spin-on glass over a substrate, forming a layer of photoresist over the spin-on glass, patterning the photoresist, patterning the spin-on glass using the photoresist as a mask, and patterning the substrate by applying an etch using the spin-on glass as a hard mask wherein the etch removes the photoresist. If desired, the substrate can be an aluminum-based layer with a planar top surface, and an antireflective coating such as titanium-nitride can be disposed between the spin-on glass and the aluminum-based layer.

In another embodiment, the spin-on glass is patterned by applying a fluorine-based plasma, whereas the substrate is patterned by applying a chlorine-based plasma. During the fluorine-based etch, an etch selectivity of the spin-on glass to the photoresist is at least 10:1. During the chlorine-based etch, an etch selectivity of the substrate to the spin-on glass is at least 10:1, and an etch selectivity of the photoresist to the substrate is at least 1:1. Advantageously, the fluorine-based plasma etches the photoresist at a significantly lower rate than the chlorine-based plasma, and the photoresist provides a buffer for the spin-on glass during a portion of the chlorine-based etch.

After the substrate is patterned, the spin-on glass can be removed, preferably using a second fluorine-based plasma that is essentially the same as the fluorine-based plasma used to pattern the spin-on glass. Alternatively, if desired, the spin-on glass can remain attached to the substrate as a permanent dielectric layer after the substrate is patterned.

These and other objects, features and advantages of the invention will be further described and more readily apparent from a review of the detailed description of the preferred embodiments which follow.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1:
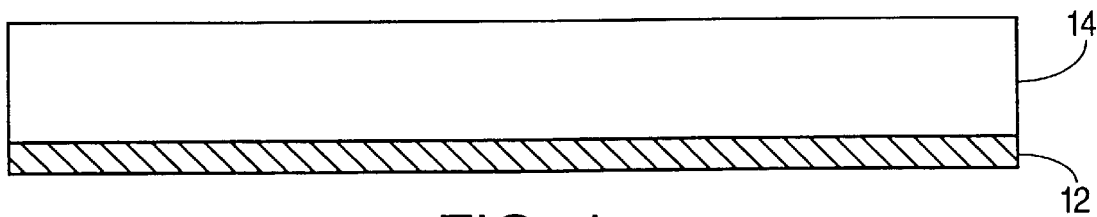
FIGS. 1–8 show cross-sectional views of successive process steps for patterning a substrate using spin-on glass as a hard mask in accordance with an embodiment of the invention.

Referring now to the drawings wherein depicted elements are not necessarily drawn to scale and wherein like or similar elements are designated by the same reference numeral throughout the several views, FIGS. 1–8 show cross-sectional views of successive steps for patterning a substrate using spin-on glass as a hard mask in accordance with an embodiment of the invention.

In FIG. 1, an underlying substrate includes aluminum-copper alloy 14 disposed on silicon dioxide base 12. Aluminum-copper alloy 14 consists of aluminum with 0.5% copper by weight, has a planar top surface, and has a thickness in the range of 4,000 to 20,000 angstroms. For instance, aluminum-copper alloy 14 has a thickness of 4,000 angstroms if used as a level-1 metal, has a thickness of 8,000 angstroms if used as a level-2, level-3, or level-4 metal, and has a thickness of 20,000 angstroms if used as a level-5 metal. Aluminum-copper alloy 14 is deposited on base 12 by sputtering or evaporation. Aluminum-copper alloy 14 represents the portion of the substrate to be patterned.

Figure 2:
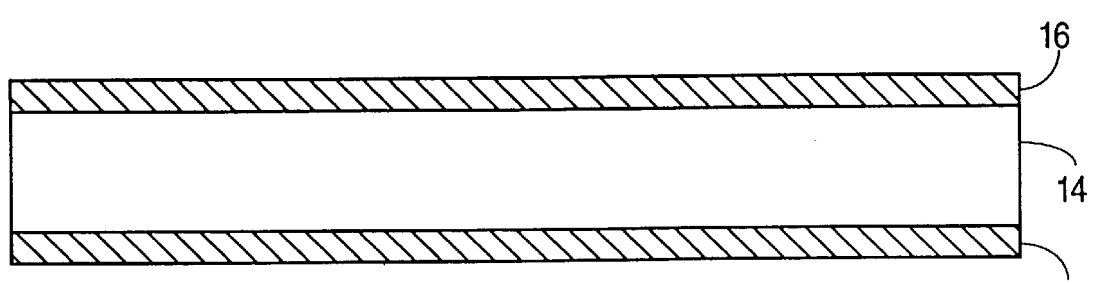

In FIG. 2, an optional layer of titanium-nitride 16 is deposited on aluminum-copper alloy 14 by sputtering or evaporation. Titanium-nitride 16 has a thickness in the range of 350 to 1100 angstroms. Titanium-nitride 16 is not essential, but it is preferred since it provides an antireflective layer for a subsequent photolithography operation. Furthermore, titanium-nitride 16 contributes to electromigration resistance of aluminum-copper alloy 14.

Figure 3:
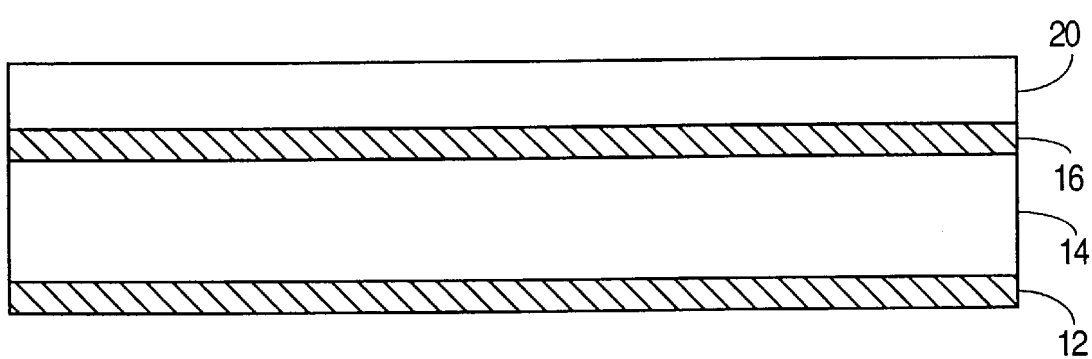

In FIG. 3, a layer of spin-on glass 20 is formed on titanium-nitride 16. Spin-on glass is formed by conventional techniques. For instance, a liquid precursor of spin-on glass is pumped onto the substrate while the substrate is rotating in order to evenly spin-coat the liquid precursor over the substrate. The thickness of the dispensed spin-on glass depends primarily on the viscosity of the liquid precursor and the spin speed of the substrate. The viscosity and spin speed are selected in relation to the thickness of aluminum-copper alloy 14, with the assumption that during a subsequent etch step the etch selectivity of aluminum-copper alloy 14 to spin-on glass 20 is at least 10:1 (that is, the aluminum-copper alloy will etch at least 10 times faster than the spin-on glass). Thereafter, the dispensed spin-on glass is partially hardened by a bake on a hot plate with a temperature in the range of 150 to 250° C., and then cured by ramping up the temperature to 430° C. in order to drive off solvents and form a hardened layer of silicon dioxide. The spin-on glass can be, for instance, a carbon-silicon based material (also known as SOG), a silicon-containing polymer, a silicon-boron glass (also known as a low K dielectric), or other $Si_xO_x$ compounds. The spin-on glass can also be either stochiometric or non-stochiometric. A suitable spin-on glass is marketed by Allied-Signal Corp. under the trade name "314".

After being cured, spin-on glass 20 has a thickness in the range of 500 to 3,000 angstroms. This thickness of spin-on glass 20 is based on the thickness of aluminum-copper alloy 14 (4,000 to 20,000 angstroms) divided by 10 (due to the 10:1 etch selectivity) with a slight safety margin (in the range of 100 to 1,000 angstroms) added in. Although a greater safety margin can be used, preferably spin-on glass 20 has a maximum thickness of 5,000 angstroms since the viscosity and spin-on characteristics tend to cause cracks at greater thicknesses. Advantageously, spin-on glass 20 is typically far easier to apply than conventional hard mask materials that are deposited from plasmas or sputter deposited.

Figure 4:
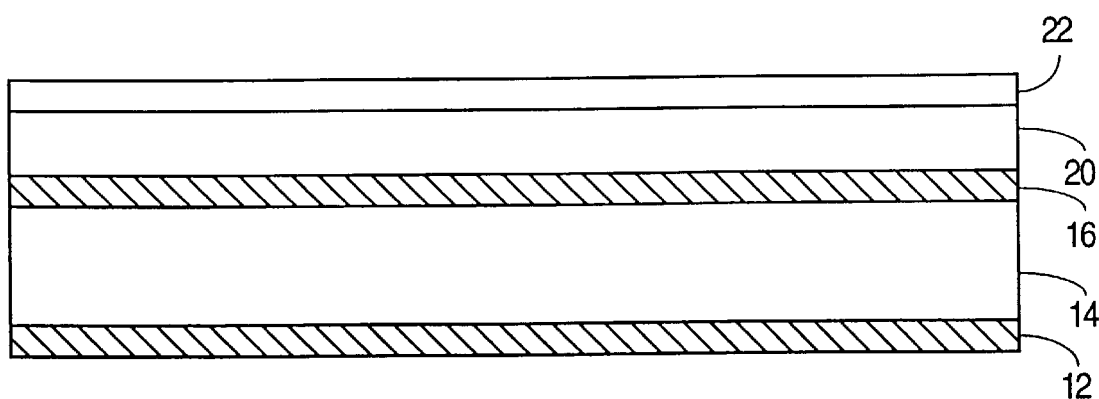

In FIG. 4, a layer of photoresist 22 is dispensed on spin-on glass 20. For instance, photoresist 22 is pumped onto the substrate while the substrate is rotating in order to evenly spin-coat photoresist 22 over the substrate.

Figure 5:
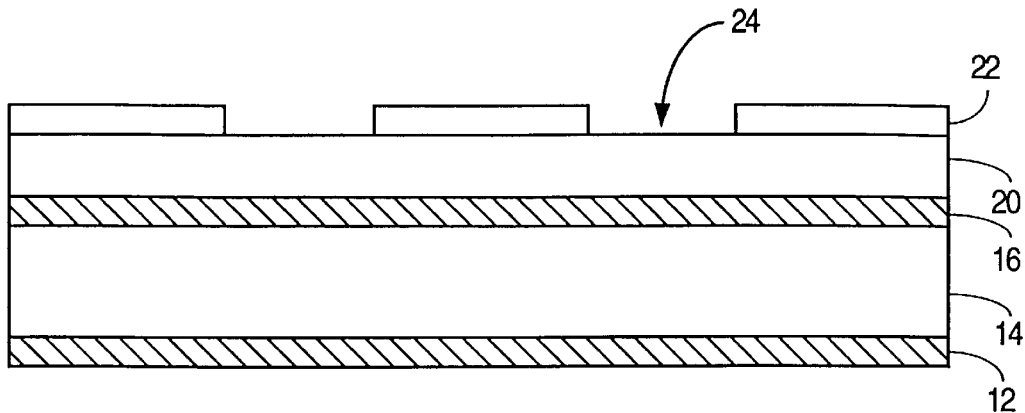

In FIG. 5, photoresist 22 is patterned using conventional lithographic techniques. For instance, selected portions of a positive-acting photoresist 22 are exposed to I-line light transferred through a reticle, and then photoresist 22 is submerged in an aqueous developer solution which removes the exposed regions. As a result, photoresist 22 contains vertical openings 24 corresponding to the reticle pattern and extending to spin-on glass 20. Titanium-nitride 16 provides an antireflective layer that improves the accuracy of openings 24 by reducing reflections of the I-line light off aluminum-copper alloy 14.

After being patterned, photoresist 22 has a thickness in the range of 5,000 to 15,000 angstroms. Preferably, photoresist 22 has a substantially greater thickness than spin-on glass 20 in order to buffer spin-on glass 20 during a subsequent etch step. Advantageously, photoresist 22 need not be any thicker than aluminum-copper alloy 14. Note that in the absence of spin-on glass 20, photoresist 22 would need a far greater thickness, for instance in the range of 15,000 to 35,000 angstroms, in order to properly pattern aluminum-copper alloy 14. Thus, spin-on glass 20 allows for thinning photoresist 22 by up to 20,000 angstroms. In this manner, spin-on glass 20 allows photoresist 22 to provide finer-pitch geometries without loss of pattern fidelity.

Figure 6:
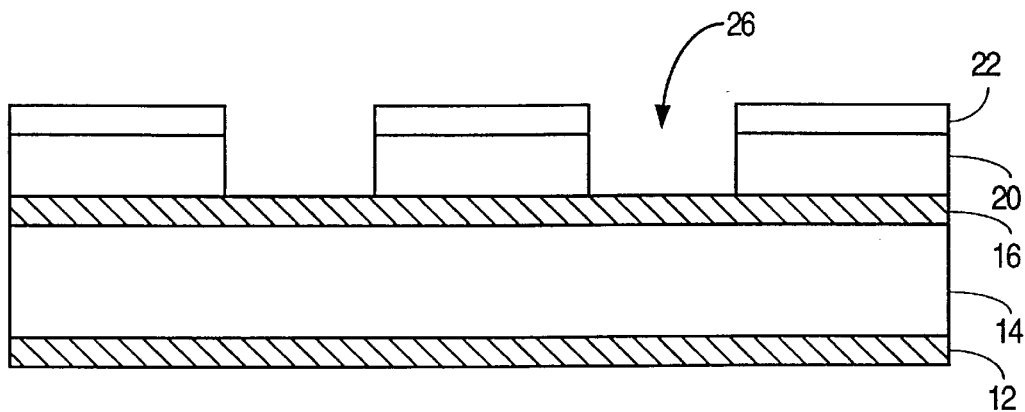

In FIG. 6, spin-on glass 20 is patterned by applying a fluorine-based plasma using photoresist 22 as an etch mask. Generally speaking, plasma etching is a dry etch technique that uses an rf plasma to generate chemically active etchants that form volatile species with the substrate. The fluorine-based plasma includes a fluorine compound such as $CF_4$ or $NF_3$ as is conventional. As the fluorine-based plasma is applied, the etch selectivity of spin-on glass 20 to photoresist 22 is in the range of 10:1 to 50:1. As a result, spin-on glass contains vertical openings 26 extending to titanium-nitride 16. Although the fluorine-based plasma removes a small upper portion (on the order of 1 to 10%) of photoresist 22, a substantial lower portion of photoresist 22 is unaffected.

Figure 7:
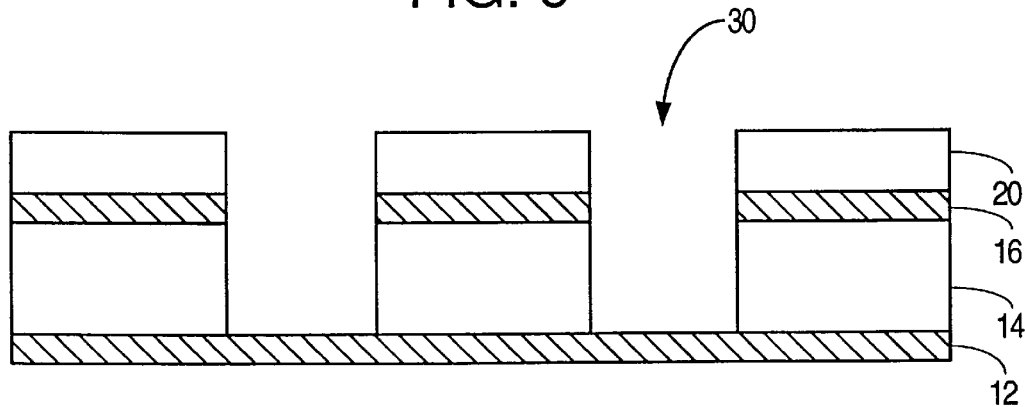

In FIG. 7, aluminum-copper alloy 14 and titanium-nitride 16 are patterned by applying a chlorine-based plasma using spin-on glass 20 a hard mask. The chlorine-based plasma includes a chlorine compound such as $BCl_3$ or $Cl_2$, as is conventional. As the chlorine-based plasma is applied, the etch selectivity of aluminum-copper 14 to spin-on glass 20 is in the range of 10:1 to 12:1, whereas the etch selectivity of photoresist 22 to aluminum-copper 14 is in the range of 1:1 to 5:1. Thus, during the chlorine-based plasma, photoresist 22 etches at least ten times faster than spin-on glass 20. As a result, the chlorine-based plasma completely removes photoresist 22, and then begins to erode and partially remove spin-on glass 20. As should be apparent, a much thicker layer of photoresist 22 would be necessary in the absence of spin-on glass 20. Furthermore, removing photoresist 22 using the chlorine-based plasma not only saves an etch step, but also has several advantages over wet resist strippers including safer operating conditions, no metal ion contamination, and reduced pollution problems. Aluminum-copper alloy 14, as patterned, includes vertical openings 30 extending to base 12.

Spin-on glass 20 has sufficient thickness to withstand the chlorine-based plasma and protect the regions of aluminum-copper alloy 14 outside openings 26, even without the assistance of photoresist 22. As mentioned above, during the fluorine-based plasma the etch selectivity of spin-on glass 20 to photoresist 22 is at least 10:1, and during the chlorine-based plasma the etch selectivity of aluminum-copper alloy 14 to spin-on glass 20 is at least 10:1. As a result, it is possible to use a spin-on glass with a thickness approximately one-tenth that of the aluminum-copper alloy, and it is also possible to use a photoresist with a thickness approximately one-tenth that of the spin-on glass. However, the preferred approach is highly conservative and provides a generous safety margin to accommodate process variations. Therefore, photoresist 22 has sufficient thickness for a major portion of it to survive the fluorine-based plasma and protect spin-on glass 20 during the initial stage of the chlorine-based plasma. After the chlorine-based plasma removes photoresist 22, the chlorine-based plasma removes a small upper portion (on the order of 10 to 20%) of spin-on glass 20. In this manner, a substantial lower portion of spin-on glass 20 survives the chlorine-based plasma, even though upon curing the spin-on glass 20 is no thicker than 5,000 angstroms. Furthermore, the thicknesses of spin-on glass 20 and photoresist 22 account for a slightly longer chlorine-based plasma as is necessary to remove titanium-nitride 16.

Figure 8:
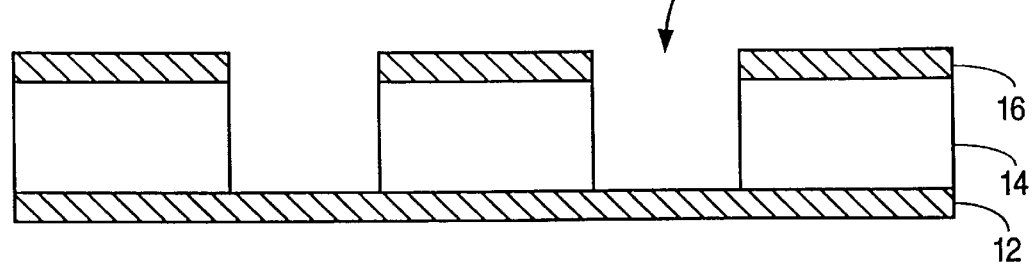

In FIG. 8, the remaining spin-on glass 20 is removed by applying a second fluorine-based plasma. For convenience, the second fluorine-based plasma uses essentially the same etchant as the first fluorine-based plasma. The second fluorine-based plasma, like the first, does not remove titanium-nitride 16 or aluminum-based metals. Instead, the titanium-nitride 16 outside openings 30 remains permanently attached to the substrate and provides a barrier layer that contributes to electromigration resistance of conductive lines formed by the patterned aluminum-copper alloy 14.

Alternatively, if desired, spin-on glass 20 can remain attached to the substrate to provide a permanent dielectric layer after patterning aluminum-copper alloy 14. Such a permanent dielectric layer serves to lower the capacitance between aluminum-copper alloy 14 and a subsequently deposited overlaying layer of metal. If spin-on glass 20 provides a permanent dielectric layer, then the second fluorine-based plasma is not be applied to the structure in FIG. 7.

The process of the invention can be repeated, if necessary, to pattern another layer of metal over aluminum-copper alloy 14.

Variations to the preferred embodiment are apparent. For instance, the substrate (or portion of the substrate) to be patterned can include an aluminum-based metal or other metals, or a semiconductor, or an insulator. As mentioned above, the antireflective layer between the substrate and the spin-on glass is optional. The spin-on glass can be patterned and/or removed using a wet etch, such as a dilute solution of hydrofluoric acid or nitric acid. The mask for patterning the spin-on glass can be a photoactive material besides photoresist, and can be patterned by photoablation or another non-lithographic technique. The invention has general utility in the manufacture of integrated circuits.

Variations and modifications of the embodiments disclosed herein may be made based on the description set forth herein, without departing from the scope and spirit of the invention as set forth in the following claims.

What is claimed is:

1. A method of patterning an underlying substrate, the method comprising:
   forming a layer of spin-on glass directly on a metal substrate;
   forming a patterned material directly on the spin-on glass;
   patterning the spin-on glass using the patterned material as an etch mask; and
   patterning the metal substrate by applying an etch using the spin-on glass as a hard mask, wherein the etch removes the patterned material.

2. The method of claim 1, wherein patterning the spin-on glass includes applying a second etch, and the method further includes removing the spin-on glass after patterning the metal substrate by applying a third etch using a same etchant as the second etch.

3. A method of patterning an underlying substrate, the method comprising:
   forming a layer of spin-on glass directly on a metal substrate;
   forming a layer of photoresist directly on the spin-on glass;
   patterning the photoresist;
   patterning the spin-on glass using the photoresist as a mask; and
   patterning the metal substrate by applying an etch using the spin-on glass as a hard mask, wherein the etch removes the photoresist and partially removes the spin-on glass.

4. The method of claim 3, wherein the metal substrate includes an aluminum-based layer that is patterned by the etch.

5. The method of claim 3, further including forming an antireflective coating on the metal substrate, and forming the spin-on glass on the antireflective coating, wherein patterning the metal substrate includes patterning the antireflective coating.

6. The method of claim 5, wherein the antireflective coating includes titanium-nitride, and the metal substrate includes an aluminum-copper alloy.

7. The method of claim 3, wherein the metal substrate has a planar top surface.

8. The method of claim 5, wherein the metal substrate and the antireflective coating each have a planar top surface.

9. The method of claim 3, wherein patterning the spin-on glass includes applying a fluorine-based plasma, and patterning the metal substrate includes applying a chlorine-based plasma.

10. The method of claim 3, including removing the spin-on glass after patterning the metal substrate.

11. The method of claim 10, wherein patterning the spin-on glass and removing the spin-on glass includes applying a same etchant.

12. The method of claim 11, wherein the same etchant is a fluorine-based plasma.

13. The method of claim 3, including leaving the spin-on glass attached to the metal substrate as a permanent dielectric layer after patterning the metal substrate.

14. The method of claim 3, wherein the photoresist is formed with a substantially greater thickness than that of the spin-on glass.

15. The method of claim 14, wherein the photoresist is formed with a thickness in the range of 5,000 to 15,000 angstroms, and the spin-on glass is formed with a thickness in the range of 500 to 3,000 angstroms.

16. The method of claim 3, wherein patterning the metal substrate includes removing in the range of 10 to 20 percent of a thickness of the spin-on glass.

17. The method of claim 3, wherein patterning the spin-on glass includes applying a plasma etch in which an etch selectivity of the spin-on glass to the photoresist is at least 10:1.

18. The method of claim 3, wherein patterning the metal substrate includes applying a plasma etch in which an etch selectivity of the metal substrate to the spin-on glass is at least 10:1, and an etch selectivity of the photoresist to the metal substrate is at least 1:1.

19. The method of claim 3, wherein the metal substrate is an aluminum-based metal, patterning the spin-on glass includes applying a fluorine-based plasma in which an etch selectivity of the spin-on glass to the photoresist is at least 10:1, and patterning the metal substrate includes applying a chlorine-based plasma in which an etch selectivity of the aluminum-based metal to the spin-on glass is at least 10:1 and an etch selectivity of the photoresist to the aluminum-based metal is at least 1:1.

20. The method of claim 19, wherein prior to applying the chlorine-based plasma, a thickness of the spin-on glass is in the range of 100 to 1,000 angstroms greater than a thickness of the aluminum-based metal divided by the etch selectivity of the aluminum-based metal to the spin-on glass.

21. A method of patterning an underlying metal substrate, the method comprising:

dispensing a layer of spin-on glass directly on a metal substrate;

curing the spin-on glass;

dispensing a layer of photoresist directly on the spin-on glass;

patterning the photoresist;

patterning the spin-on glass by applying a fluorine-based plasma using the photoresist as a mask; and patterning the metal substrate by applying a chlorine-based plasma using the spin-on glass as a hard mask, wherein the chlorine-based plasma removes the photoresist and partially removes the spin-on glass.

22. The method of claim 21, wherein the spin-on glass is dispensed on a layer of antireflective coating formed on the metal substrate, and patterning the metal substrate includes patterning the antireflective coating.

23. The method of claim 21, including removing the spin-on glass after patterning the metal substrate by applying a second fluorine-based plasma.

24. The method of claim 22, including removing the spin-on glass after patterning the metal substrate by applying a second fluorine-based plasma, and leaving the antireflective coating exposed by the second fluorine-based plasma attached to the metal substrate as a barrier layer.

25. The method of claim 24, wherein the antireflective coating is titanium-nitride.

26. The method of claim 21, including leaving the spin-on glass attached to the metal substrate as a permanent dielectric layer after patterning the metal substrate.

27. The method of claim 21, wherein an etch selectivity of the spin-on glass to the photoresist while applying the fluorine-based plasma is at least 10:1, and an etch selectivity of the substrate to the spin-on glass while applying the chlorine-based plasma is at least 10:1.

28. The method of claim 27, wherein an etch selectivity of the photoresist to the metal substrate while applying the chlorine-based plasma is in the range of 1:1 to 5:1.

29. A method of patterning an underlying aluminum-based layer during manufacture of an integrated circuit, the method comprising in sequence:

forming an aluminum-based layer directly on a semiconductor base;

dispensing a layer of spin-on glass directly on the aluminum-based layer;

curing the spin-on glass, wherein the cured spin-on glass has a thickness in the range of 500 to 5,000 angstroms;

dispensing a layer of photoresist directly on the spin-on glass;

patterning the photoresist by exposing selected areas of the photoresist to light and then immersing the photoresist in a developer solution, wherein the patterned photoresist has a thickness in the range of 5,000 to 15,000 angstroms;

patterning the spin-on glass by applying a fluorine-based plasma using the photoresist as a mask, thereby partially removing the photoresist; and patterning the aluminum-based layer by applying a chlorine-based plasma using the spin-on glass as a hard mask, wherein the chlorine-based plasma removes the photoresist and partially removes the spin-on glass, and an etch selectivity of the aluminum-based layer to the spin-on glass is at least 10:1.

\* \* \* \* \*